United States Patent
Chen et al.

(10) Patent No.: US 11,442,094 B2
(45) Date of Patent: Sep. 13, 2022

(54) POLYGONAL SPHERICAL SPACE SAMPLING DEVICE

(71) Applicant: Shenzhen Xinyi Technology Co., Ltd., Guangdong (CN)

(72) Inventors: Linbin Chen, Guangdong (CN); Zhenkun Xie, Guangdong (CN); Daoyi Wang, Guangdong (CN); Cien Sun, Guangdong (CN); Kaixuan Jiang, Guangdong (CN)

(73) Assignee: Shenzhen Xinyi Technology Co., Ltd., Guangdong (CN)

( * ) Notice: Subject to any disclaimer, the term of this patent is extended or adjusted under 35 U.S.C. 154(b) by 0 days.

(21) Appl. No.: 17/335,098

(22) Filed: Jun. 1, 2021

(65) Prior Publication Data

US 2022/0187355 A1    Jun. 16, 2022

(30) Foreign Application Priority Data

Dec. 10, 2020    (CN) .......................... 202011455911.5

(51) Int. Cl.
*G01R 27/28* (2006.01)
*G01R 29/10* (2006.01)
*H05K 9/00* (2006.01)

(52) U.S. Cl.
CPC ......... *G01R 29/105* (2013.01); *H05K 9/0009* (2013.01)

(58) Field of Classification Search
CPC .............. G01R 29/105; G01R 29/0814; G01R 29/0821; G01R 29/0878; G01R 29/0892;
(Continued)

(56) References Cited

U.S. PATENT DOCUMENTS 10,404,384 B1 * 9/2019  Mellein ................ H04B 17/102
11,012,163 B1 * 5/2021  Rafiee Alavi .......... H04B 17/12
(Continued)

FOREIGN PATENT DOCUMENTS

CN    103812586 A    5/2014
CN    210222131      3/2020
(Continued)

OTHER PUBLICATIONS

"Office Action of China Counterpart Application", dated Oct. 25, 2021, p. 1-p. 4.

*Primary Examiner* — Thang X Le
(74) *Attorney, Agent, or Firm* — Cooper Legal Group, LLC (57) ABSTRACT

This application provides a polygonal spherical sampling device, belonging to the technical field of spherical field antenna measurement, and including a probe, a mounting rack and a supporting platform. The supporting platform is mounted on the mounting rack for placing an object to be tested. The number of the probes is more than or equal to six, the probes are mounted on the mounting rack and a plurality of the probes are distributed on at least two vertical planes in a three-dimensional spherical space and are arranged around the supporting platform. The vertical planes are arranged symmetrically about a vertical axis, the probes are uniformly distributed at intervals of A degrees on each vertical plane, the probes on a same horizontal plane are uniformly distributed at intervals of B degrees, both A and B are less than or equal to 90.

9 Claims, 6 Drawing Sheets

(58) Field of Classification Search
CPC ............ G01R 29/0871; G01R 31/2822; G01R 31/3025; G01R 31/311; G01R 31/303
See application file for complete search history.

(56) References Cited

U.S. PATENT DOCUMENTS

| | | |
|---|---|---|
| 2009/0231217 A1 | 9/2009 | Grange et al. |
| 2013/0207680 A1 | 8/2013 | Garreau et al. |
| 2014/0122049 A1* | 5/2014 | Kyosti .................. H04B 15/00 703/13 |
| 2018/0172746 A1* | 6/2018 | Luo .................... G01R 29/0821 |
| 2019/0181963 A1* | 6/2019 | Liang .................. H04B 7/0608 |
| 2020/0244377 A1* | 7/2020 | Maruo ............... H04B 17/3912 |

FOREIGN PATENT DOCUMENTS

| | | |
|---|---|---|
| CN | 210222131 U | 3/2020 |
| CN | 112014652 A | 12/2020 |

\* cited by examiner

POLYGONAL SPHERICAL SPACE SAMPLING DEVICE

CROSS-REFERENCE TO RELATED APPLICATION

The present application is based on and claims the priority benefits of China application No. 202011455911.5, filed on Dec. 10, 2020. The entirety of the above-mentioned patent application is hereby incorporated by reference herein and made a part of this specification.

BACKGROUND

Technical Field

The present application relates to the technical field of spherical field antenna measurement, and more particularly to a polygonal spherical sampling device.

Description of Related Art

Near-field measurement refers to recording the relationship between the amplitude of a voltage received by the probe with known electrical characteristics, and the phase change along with position on a surface of a near area, at a distance of 3-8 wavelengths from the antenna, and determining the far-field characteristic of the antenna by strictly near-to-far-field mathematical transformation. Depending on shapes of the scanning surface, near-field measurement is classified into a planar near-field measurement, a cylindrical near-field measurement, and a spherical near-field measurement. The spatial sampling technology is a key technology for spherical near-field measurement, and the accuracy of sampling data directly affects the field transformation result of electromagnetic waves, which is a key factor for influencing system errors.

The spherical near-field space sampling schemes at current stage are as follows: the plurality of probes are distributed on an annular structure at equal intervals, sampling data on one surface of the object to be tested are obtained by electrically switching the probes, and the sampling data on a plurality of surfaces of the object to be tested are obtained by rotating the object to be tested on the measuring platform by 180°, thereby obtaining spherical space sampling data of the object to be tested.

It is found that the prior art suffers from at least the following defects: the turntable is rotated mechanically, one mechanical rotation needs to be performed for each test, to drive the object to be tested to rotate by an angle, and the test efficiency is not ideal.

SUMMARY

In order to improve the problem of low-test efficiency caused by the use of a turntable structure in a common sampling device, this application provides a polygonal spherical space sampling device.

This application provides a polygonal spherical space sampling device, which adopts the following technical solutions:

A polygonal spherical space sampling device, including a probe, a mounting rack and a supporting platform. The supporting platform is mounted on the mounting rack for placing an object to be tested. The number of the probes is more than or equal to six, the probes are mounted on the mounting rack and a plurality of the probes are distributed on at least two vertical planes in a three-dimensional spherical space and are arranged around the supporting platform. The vertical planes are arranged symmetrically about a vertical axis, the probes are uniformly distributed at intervals of A degrees on each vertical plane, the probes on a same horizontal plane are uniformly distributed at intervals of B degrees, both A and B are less than or equal to 90. Centers at the top and the bottom of the mounting rack respectively share one of the probes, the number of the probes is N=360/B (180/A−1)+2, A and B are both positive numbers and 180 is divisible by each of A and B.

By adopting the above technical solutions, a turntable structure in a common sampling device is eliminated, after the object to be tested is placed on the supporting platform, the object to be tested is in a static state; when the sampling data of the object to be tested needs to be measured omnidirectionally, the object to be tested is always in a static state, since the plurality of probes are distributed in a three-dimensional spherical space, the probe at each point is activated by electrically controlled switching, there is no mechanical rotation of a turntable, the test efficiency is higher, and the present application is more suitable for the rapid measurement requirement of the production line. Furthermore, the turntable serves as an arbitrarily movable component, the rotation precision of the turntable has a large uncertainty, therefore, the test precision of the whole sampling device is not affected by the rotation precision of the turntable, and the test precision is higher. The maximum weight of the object to be tested is not limited by the bearing capacity of the turntable, an extremely heavy object to be tested can be placed on the supporting platform, and the range of the object to be tested is larger. Since the bottom of the sampling device does not need to be mounted with a turntable, the bottom of the sampling device can also be mounted with a probe, so that the arrangement orientation of the probe can be more comprehensive, the test precision is further improved, and a turntable with a relatively complex structure is omitted, which is beneficial for reducing the volume of the sampling device, and is convenient for handling, mounting and later maintenance of the sampling device. If the topmost and bottommost of the three-dimensional spherical space are not provided with a probe, during testing, representative key data at the two points will be missing, which results in inaccurate test results and impaired reference value. Centers at the top and the bottom of the mounting rack are just located at the topmost and bottommost of the three-dimensional spherical space, if probes are provided at the two points, the design of the structure is more reasonable.

Preferably, the mounting rack includes two mounting frames arranged perpendicular to one another and a base. The two mounting frames are both perpendicular to an upper surface of the base, the A is 45, the B is 90, the number of the probes is equal to fourteen, a junction joint at the top of the two mounting frames and a junction joint at the bottom of the two mounting frames respectively share one of the probes.

By adopting the above technical solutions, the probes are distributed more densely and uniformly, the number of the test points is relatively large, the test result is more accurate, and meanwhile the structure of the mounting rack is relatively simple.

Preferably, the mounting rack includes a base and three mounting frames arranged symmetrically around a vertical axis, the three mounting frames are perpendicular to an upper surface of the base, the A is 45, the B is 60, the number of the probes is equal to twenty, a junction joint at the top of the three mounting frames and a junction joint at the bottom of the three mounting frames respectively share one of the probes.

By adopting the above technical solutions, the probes are distributed more densely and uniformly, the number of the test points is relatively large, and the test result is more accurate.

Preferably, the supporting platform includes a connecting portion and a supporting plate, the supporting plate is fixed to the mounting rack through the connecting portion, and the supporting plate is provided with a weight reducing hole.

By adopting the above technical solutions, the connecting portion provides a stable mounting position for the supporting plate, to ensure that the supporting plate is close to the center of the three-dimensional spherical space. The supporting plate facilitates the object to be tested to be placed stably. The weight reducing hole has the effects of reducing weight and reducing consumables.

Preferably, the supporting plate is detachably mounted with test jigs with different heights, or the supporting plate is adjustably mounted on the connecting portion and has a height adjustment function.

By adopting the above technical solutions, when different objects to be measured are tested, test jigs with different heights or the supporting plate with adjustable heights both ensures that the object to be tested is at the center of the three-dimensional spherical space during testing, and the applicability of the device is higher, and the test precision is more accurate.

Preferably, an outer surface of the mounting rack is wrapped with a wave absorbing foam, and the wave absorbing foam is provided with a through hole for mounting the probe.

By adopting the above technical solutions, the wave absorbing foam can absorb or greatly reduce the energy of the electromagnetic waves received on its surface, thereby reducing the interference of the electromagnetic waves, and further improving the test precision.

Preferably, the mounting rack is mounted in an electromagnetic shielding case, the electromagnetic shielding case is provided with a door, and an inner wall of the electromagnetic shielding case and an inner surface of the door are both provided with a wave absorbing foam.

By adopting the above technical solutions, the electromagnetic shielding case can protect the probe, and have a better electromagnetic shielding effect, which is beneficial to the physical health of testers, provides a necessary near-field test environment for testing, and the wave-absorbing foam can absorb or greatly reduce the electromagnetic wave energy received by the surface of the wave-absorbing foam, so that the interference of the electromagnetic wave is reduced, and the test precision is further improved.

Preferably, both the top and outer peripheral sidewalls of the mounting rack are provided with a metal wiring box.

By adopting the above technical solutions, a plurality of probes are added in a three-dimensional spherical space of the device. The added metal wiring box may be laid with more wires, to collect probe signals at various points in the three-dimensional spherical space. Furthermore, messy can be avoided due to excessive electric wires. Meanwhile, the metal wiring box is arranged on the top and outer peripheral sidewalls of the mounting rack, excessively electric wires can be avoided to be close to the probe, and the metal wiring box can prevent the electric wires from causing a large electromagnetic interference. The test precision is improved.

Preferably, the mounting rack is welded from steel plates and/or assembled from steel plates by bolts, and a part of the steel plates is provided with perforations.

By adopting the above technical solutions, the structural strength of the steel plate is relatively high, the structural stability of the whole device is improved, and materials are easy to obtain, and compared with the pouring process, the manufacture is very convenient, the weight of the mounting rack can be reduced to some extent by perforation, and the device is conveniently transported and transferred.

In summary, this application includes at least one of the following beneficial technical effects:

1. a turntable structure in a common sampling device is eliminated, after the object to be tested is placed on the supporting platform 3, the object to be tested is in a static state; when the sampling data of the object to be tested needs to be measured omnidirectionally, the object to be tested is always in a static state, since the plurality of probes 1 are distributed in a three-dimensional spherical space, the probe at each point is activated by electrically controlled switching, there is no mechanical rotation of a turntable, the test efficiency is higher, and the present application is more suitable for the rapid measurement requirement of the production line;

2. when different objects to be measured are tested, test jigs with different heights or the supporting plate with adjustable heights both ensures that the object to be tested is at the center of the three-dimensional spherical space during testing, and the applicability of the device is higher, and the test precision is more accurate.

DESCRIPTION OF THE EMBODIMENTS

Hereinafter, this application will be explained in more detail with reference to the FIGS. 1-5.

Figure 1:
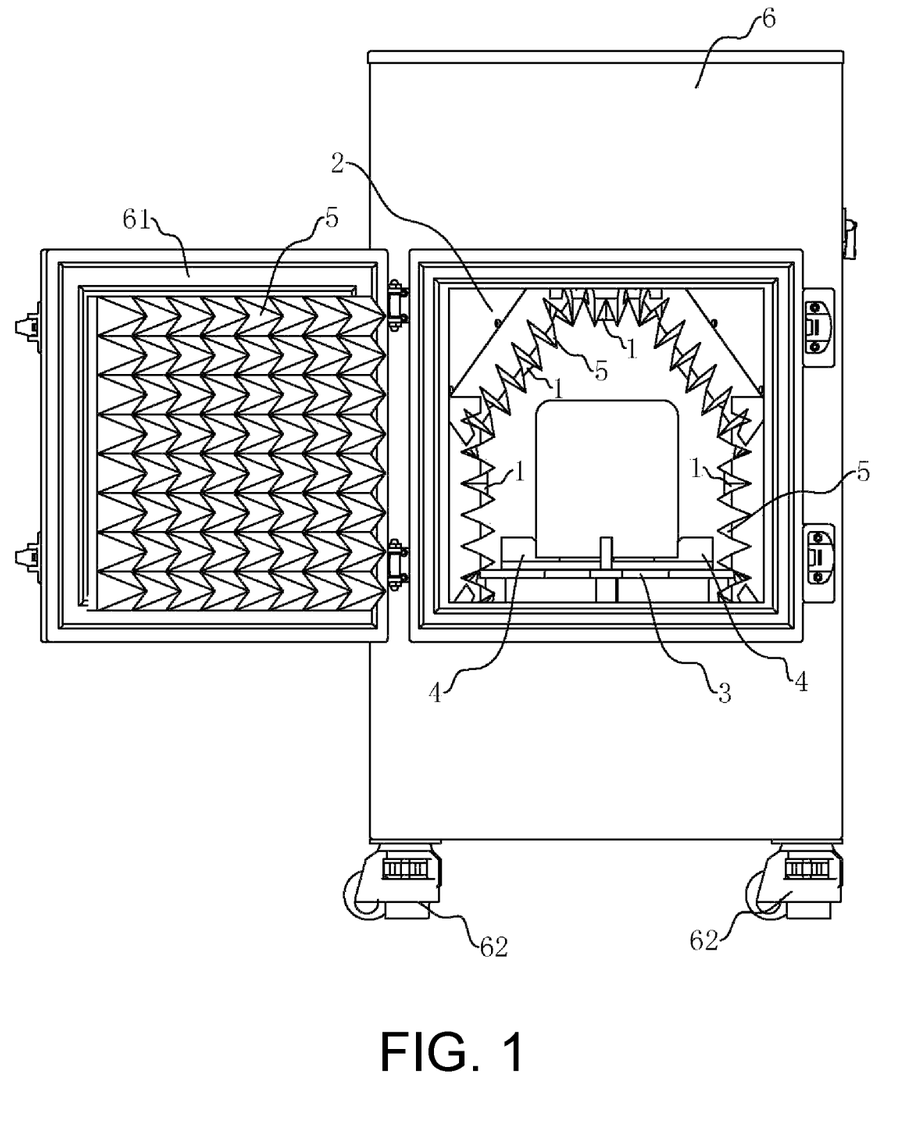
FIG. 1 is a schematic structural diagram of a polygonal spherical space sampling device according to Embodiment 1 of the present application.

Embodiments of the present application disclose a polygonal spherical space sampling device. Referring to FIG. 1, the polygonal spherical space sampling device includes a probe 1, a mounting rack 2 and a supporting platform 3. The supporting platform 3 is mounted on the mounting rack 2 for placing an object to be tested. The number of the probes 1 is more than or equal to six, the probes 1 are mounted on the mounting rack 2, a plurality of the probes 1 are distributed on at least two vertical planes in a three-dimensional spherical space and are arranged around the supporting platform 3, and each probe 1 is arranged towards the center of the three-dimensional spherical space.

The vertical planes are arranged symmetrically about a vertical axis, the probes 1 are uniformly distributed at intervals of A degrees on each vertical plane, the probes 1 on a same horizontal plane are uniformly distributed at intervals of B degrees, both A and B are less than or equal to 90. Centers at the top and the bottom of the mounting rack 2 respectively share one of the probes 1, the number of the probes 1 is N=360/B (180/A−1)+2, A and B are both positive numbers and 180 is divisible by each of A and B, for example, A can be equal to 1, 2, 5, 10, 11.25, 15, 22.5, 30, 45, 60, or 90, for example, B can be equal to 1, 2, 2.5, 10, 11.25, 15, 22.5, 30, 45, 60, or 90.

Embodiment 1

Figure 2:
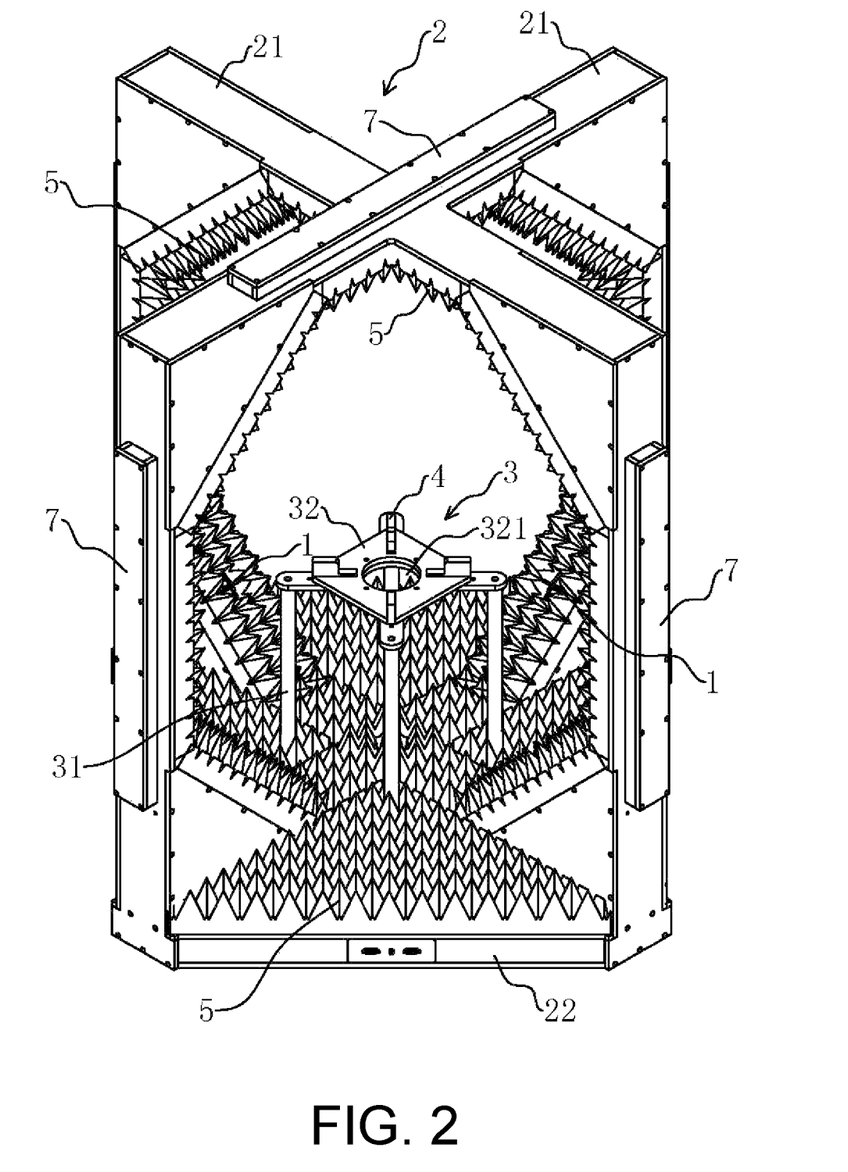
FIG. 2 is a schematic structural diagram of a mounting rack of Embodiment 1 of the present application.
Figure 3:
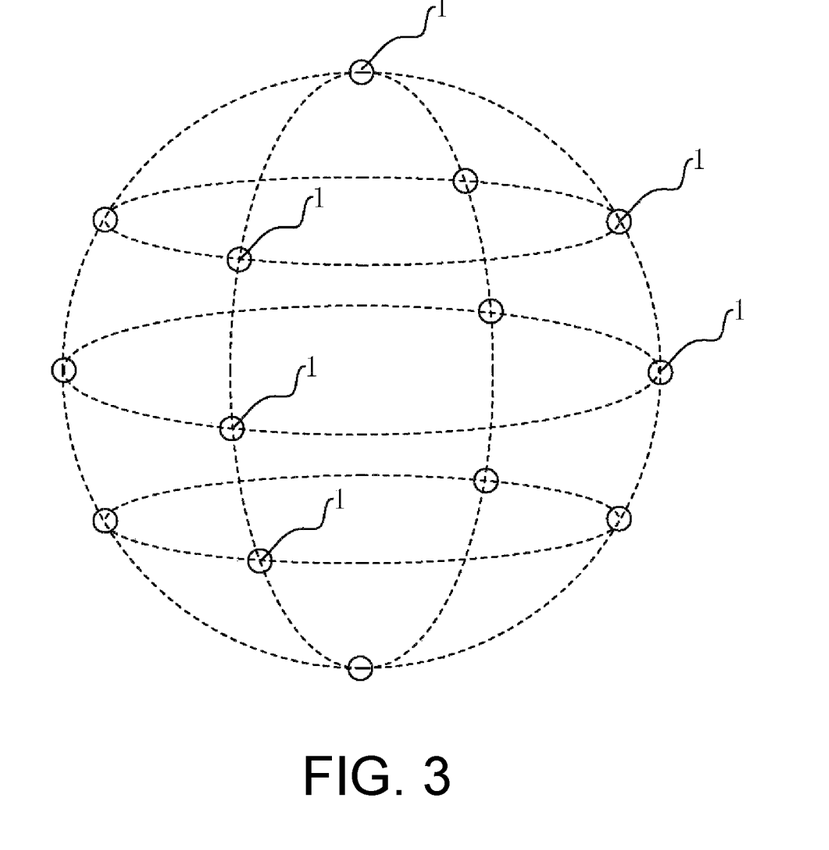
FIG. 3 is a schematic diagram of the arrangement of probes in the three-dimensional spherical space of Embodiment 1 of the present application.

Referring to FIGS. 1 and 2, the mounting rack 2 of a polygonal spherical space sampling device includes two mounting frames 21 arranged perpendicular to one another and a base 22. The two mounting frames 21 are both perpendicular to an upper surface of the base 22 (in other embodiments, the mounting frames 21 may be arranged horizontally, but the base 22 may be replaced by a vertical square frame), the A is 45, the B is 90, the number of the probes 1 is equal to fourteen, the arrangement of the fourteen probes 1 in a three-dimensional spherical space is shown in detail in FIG. 3, a junction joint at the top of the two mounting frames 21 and a junction joint at the bottom of the two mounting frames 21 respectively share one of the probes 1.

The supporting platform 3 includes a connecting portion 31 and a supporting plate 32, the supporting plate 32 is fixed to the mounting rack 2 through the connecting portion 31, and the supporting plate 32 is provided with a weight reducing hole 321. In this embodiment, the connecting portion 31 particularly includes four supporting legs and one cross frame, the four supporting legs are all fixed to the base 22 and are staggered at the bottom of the two mounting frames 21, the cross frame is fixedly connected to tops of the four supporting legs, and the supporting plate 32 is fixed to the cross frame by screws.

The supporting plate 32 is detachably mounted with test jigs 4 with different heights, or in other embodiments, the supporting plate 32 is adjustably mounted on the connecting portion 31. For example, a first height adjustment solution is that, the supporting leg has a height adjustment function, while a second height adjustment solution is that, the connecting portion 31 is provided with a plurality of slots arranged at intervals in the top-bottom direction, and the supporting plate 32 can be inserted into slots at different heights when the height of the supporting plate 32 needs to be adjusted.

An outer surface of the mounting frame 21 and an upper surface of the base 22 are wrapped with a wave absorbing foam 5. The wave absorbing foam 5 also can be replaced with other wave absorbing materials (for example, wave absorbing ceramic, etc.). The wave absorbing foam 5 is provided with a through hole for mounting the probe 1, the mounting rack 2 is mounted in an electromagnetic shielding case 6, and the electromagnetic shielding case 6 is in a rectangular parallelepiped shape.

The bottom of the electromagnetic shielding case 6 is provided with four height adjustable feet 62, to ensure that the electromagnetic shielding case 6 can be horizontally placed on the ground, thereby improving the test precision. The electromagnetic shielding case 6 is provided with a door 61, one side of the door 61 is hinged to the electromagnetic shielding case 6, the electromagnetic shielding case 6 is formed with a rectangular opening at the door 61, the rotation axis of the door 61 is vertically arranged, the other side of the door 61 and the electromagnetic shielding case 6 are connected via a lock catch member, and an inner wall of the electromagnetic shielding case 6 and an inner surface of the door 61 are both provided with a wave absorbing foam 5.

Furthermore, the two mounting frames 21 are respectively located on two diagonal lines of the electromagnetic shielding case 6, thereby improving space utilization inside the electromagnetic shielding case 6, and facilitating the worker to pick and place objects to be tested from the electromagnetic shielding case 6. Besides, no probe 1 is mounted on the door 61, then no complicated line is provided on the door 61, which is beneficial for subsequent upgrading and rebuilding of the device.

The top of the mounting rack 2 is welded with a horizontally arranged metal wiring box 7, and outer peripheral sidewalls of the mounting frame 21 are all provided with a vertically arranged metal wiring box 7. The metal wiring box 7 is welded with steel plates and has a rectangular elongated strip shape, and the specific number of the metal wiring boxes 7 is five.

The mounting rack 2 is welded from steel plates and/or assembled from steel plates by bolts, and a part of the steel plates is provided with perforations. An overall profile of the mounting rack 2 is a box shape, and the middle of the mounting rack 2 is formed with a regular octagonal hole, in other embodiments, as the number of the probes 1 is increased, the regular octagonal hole can be replaced with a regular decagonal hole, a regular dodecagonal hole, a regular hexadecagonal hole, a regular dodecagonal hole, and etc.

A control system (for example, a functional unit for implementing radio frequency switching, a cable interface, etc.) of the whole device may be mounted on the top, the bottom, or the periphery of the electromagnetic shielding case 6, and in this embodiment, it is preferable to arrange on the top, so as to save space.

The implementation principle of Embodiment 1 is that, a turntable structure in a common sampling device is eliminated, after the object to be tested is placed on the supporting platform 3, the object to be tested is in a static state; when the sampling data of the object to be tested needs to be measured omnidirectionally, the object to be tested is always in a static state, since the plurality of probes 1 are distributed in a three-dimensional spherical space, the probe 1 at each point is activated by electrically controlled switching, there is no mechanical rotation of a turntable, the test efficiency is higher, and the present application is more suitable for the rapid measurement requirement of the production line. Furthermore, the turntable serves as an arbitrarily movable component, the rotation precision of the turntable has a large uncertainty, therefore, the test precision of the whole sampling device is not affected by the rotation precision of the turntable, and the test precision is higher. The maximum weight of the object to be tested is not limited by the bearing capacity of the turntable, an extremely heavy object to be tested can be placed on the supporting platform 3, and the range of the object to be tested is larger. Since the bottom of the sampling device does not need to be mounted with a turntable, the bottom of the sampling device can also be mounted with a probe 1, so that the arrangement orientation of the probe 1 can be more comprehensive, the test precision is further improved, and a turntable with a relatively complex structure is omitted, which is beneficial for reducing the volume of the sampling device, and is convenient for handling, mounting and later maintenance of the sampling device.

Embodiment 2

Figure 4:
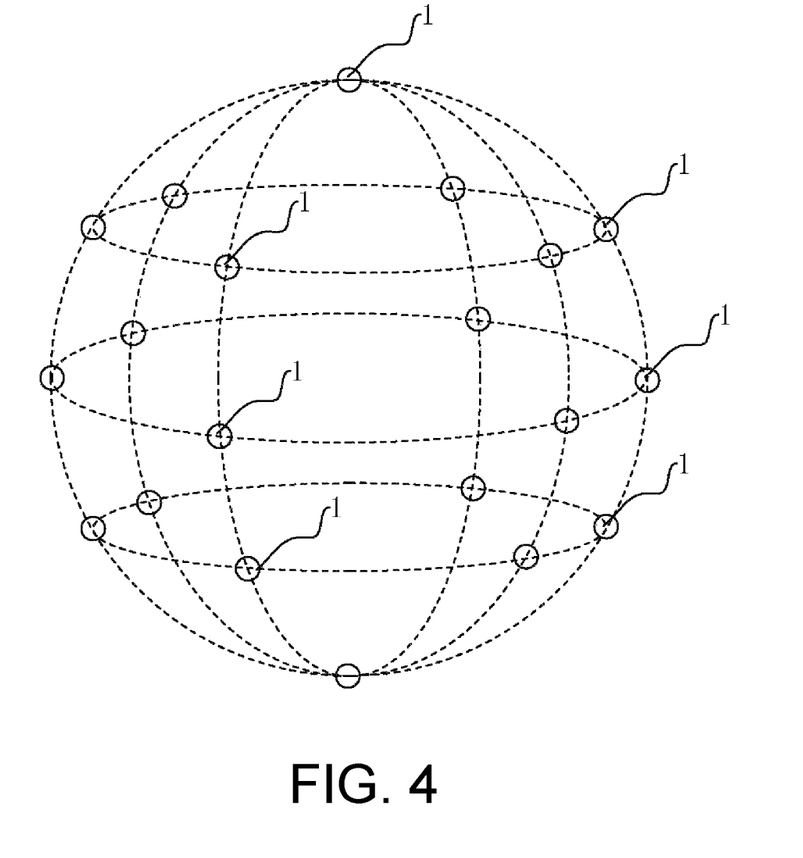
FIG. 4 is a schematic diagram of the arrangement of probes in the three-dimensional spherical space of Embodiment 2 of the present application.

Referring to FIGS. 2 and 4, a polygonal spherical space sampling device differs from the Embodiment 1 in that: the mounting rack 2 includes a base 22 and three mounting frames 21 arranged symmetrically around a vertical axis, the three mounting frames 21 are perpendicular to an upper surface of the base 22 (not shown in the drawings of the present application, however, the structures of the three mounting frames 21 are consistent with those in FIG. 2. and the angle between the three mounting frames 21 is 60 degrees), the A is 45, the B is 60, the number of the probes is equal to twenty, the arrangement of the twenty probes 1 in a three-dimensional spherical space is shown in detail in FIG. 4, a junction joint at the top of the three mounting frames 21 and a junction joint at the bottom of the three mounting frames 21 respectively share one of the probes 1.

The probes 1 are distributed more densely and uniformly, the number of the test points is relatively large, and the test result is more accurate.

Embodiment 3

Figure 5:
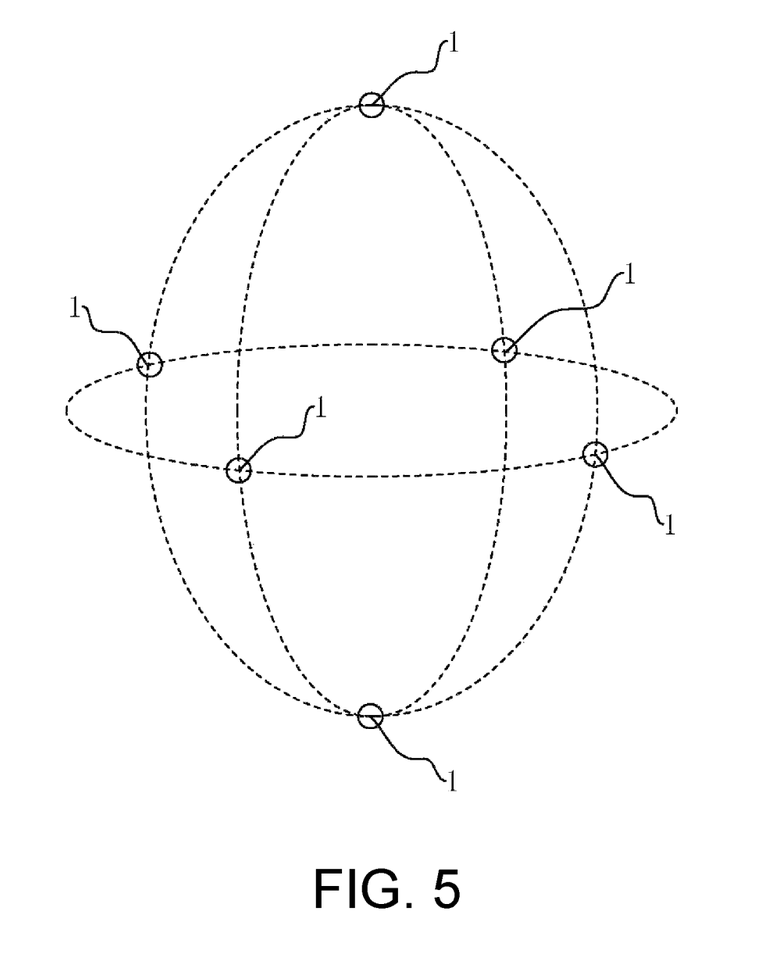
FIG. 5 is a schematic diagram of the arrangement of probes in the three-dimensional spherical space of Embodiment 3 of the present application.

Referring to FIGS. 2 and 5, a polygonal spherical space sampling device differs from the Embodiment 1 in that: the mounting rack 2 includes two mounting frames 21 arranged perpendicular to one another and a base 22; the two mounting frames 21 are both perpendicular to an upper surface of the base 22 (not shown in the drawings of the present application, however, the structures of the two mounting frames 21 are consistent with those in FIG. 2), both A and B are equal to 90, the number of the probes is equal to six, the arrangement of the six probes 1 in a three-dimensional spherical space is shown in detail in FIG. 5, a junction joint at the top of the two mounting frames 21 and a junction joint at the bottom of the two mounting frames 21 respectively share one of the probes 1.

The probes 1 are distributed in such a way that the number of the probes 1 is minimum while the manufacturing cost of the entire device is the lowest.

Embodiment 4

Figure 6:
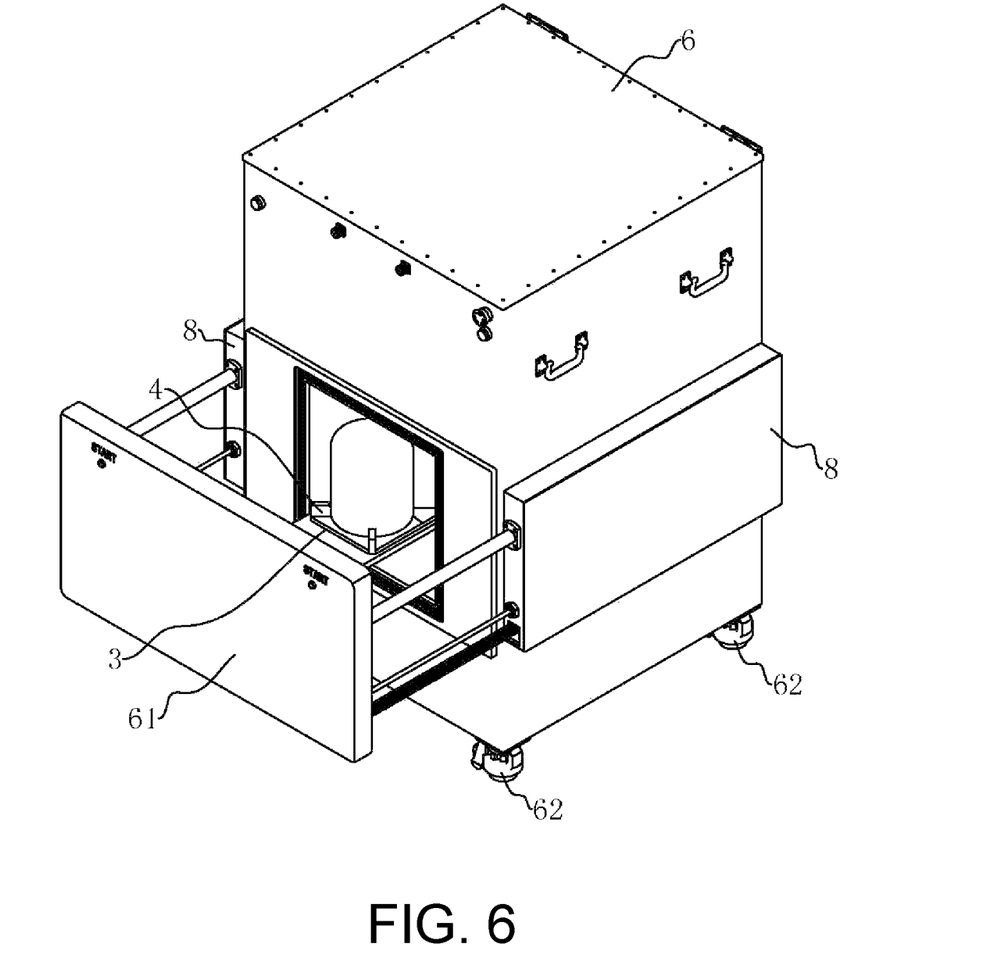
FIG. 6 is a schematic structural diagram of a polygonal spherical space sampling device according to Embodiment 4 of the present application.

Referring to FIGS. 2 and 6, a polygonal spherical space sampling device differs from Embodiment 1 in that: the electromagnetic shielding case 6 is provided with a door 61, two sides of the electromagnetic shielding case 6 are respectively fixedly mounted with a cylinder power element 8, and a piston rod end of the cylinder power element 8 is connected to an inner surface of the door 61. When the piston rod of the cylinder power element 8 is extended, the door 61 is in an open state; when the piston rod of the cylinder power element 8 is retracted, the door 61 is in a closed state. Through the above structure, it is convenient for a worker to automatically control the opening of the door 6, to pick and place objects to be tested, and a button for controlling the activation of the cylinder power element 8 can be added on the front surface of the door 61, so that the automation degree is higher and the operation is more convenient.

The above description is only preferred embodiments of the present application and is not intended to limit the protection scope of the present application. Therefore, all equivalent changes of the structure, shape or principle according to the spirit of the present application should be all included in the protection scope of the present application.

What is claimed is:

1. A polygonal spherical space sampling device, comprising a plurality of probes, a mounting rack and a supporting platform, wherein the supporting platform is mounted on the mounting rack for placing an object to be tested; a number of the plurality of probes is more than or equal to six, the plurality of probes are mounted on the mounting rack and the plurality of probes are distributed on at least two vertical planes in a three-dimensional spherical space and are arranged around the supporting platform; the at least two vertical planes are arranged symmetrically about a vertical axis, the plurality of probes are uniformly distributed at intervals of A degrees on each of the at least two vertical planes, the plurality of probes on a same horizontal plane are uniformly distributed at intervals of B degrees, both A and B are less than or equal to 90, centers at a top and a bottom of the mounting rack respectively share one of the plurality of probes, the number of the plurality of probes is $N=360/B$ $(180/A-1)+2$, A and B are both positive numbers and 180 is divisible by each of A and B.

2. The polygonal spherical space sampling device according to claim 1, wherein the mounting rack comprises two mounting frames arranged perpendicular to one another and a base; the two mounting frames are both perpendicular to an upper surface of the base, the A is 45, the B is 90, the number of the plurality of probes is equal to fourteen, a junction joint at a top of the two mounting frames and a junction joint at a bottom of the two mounting frames respectively share one of the plurality of probes.

3. The polygonal spherical space sampling device according to claim 1, wherein the mounting rack comprises a base and three mounting frames arranged symmetrically around a vertical axis, the three mounting frames are perpendicular to an upper surface of the base, the A is 45, the B is 60, the number of the plurality of probes is equal to twenty, a junction joint at a top of the three mounting frames and a junction joint at a bottom of the three mounting frames respectively share one of the plurality of probes.

4. The polygonal spherical space sampling device according to claim 1, wherein the supporting platform comprises a connecting portion and a supporting plate, the supporting plate is fixed to the mounting rack through the connecting portion, and the supporting plate is provided with a weight reducing hole.

5. The polygonal spherical space sampling device according to claim 4, wherein the supporting plate is detachably mounted with test jigs with different heights, or the supporting plate is adjustably mounted on the connecting portion and has a height adjustment function.

6. The polygonal spherical space sampling device according to claim 1, wherein an outer surface of the mounting rack is wrapped with a wave absorbing foam, and the wave absorbing foam is provided with a plurality of through holes for mounting the plurality of probes.

7. The polygonal spherical space sampling device according to claim 6, wherein the mounting rack is mounted in an electromagnetic shielding case, the electromagnetic shielding case is provided with a door, and an inner wall of the electromagnetic shielding case and an inner surface of the door are both provided with a wave absorbing foam.

8. The polygonal spherical space sampling device according to claim 1, wherein both the top and outer peripheral sidewalls of the mounting rack are provided with a metal wiring box.

9. The polygonal spherical space sampling device according to claim 1, wherein the mounting rack is welded from steel plates and/or assembled from steel plates by bolts, and a part of the steel plates is provided with perforations.

\* \* \* \* \*